(12) United States Patent
Younis et al.

(10) Patent No.: US 6,292,122 B1
(45) Date of Patent: Sep. 18, 2001

(54) DIGITAL-TO-ANALOG INTERFACE CIRCUIT HAVING ADJUSTABLE TIME RESPONSE

(75) Inventors: Saed Younis; Emilija Simic; Thomas Wilborn, all of San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 0 days.

(21) Appl. No.: 09/517,766

(22) Filed: Mar. 4, 2000

(51) Int. Cl.$^7$ ...................................................... H03M 3/00
(52) U.S. Cl. ............................................. 341/143; 341/139
(58) Field of Search ..................... 341/139, 143, 341/152, 157

(56) References Cited

U.S. PATENT DOCUMENTS

| | | | |
|---|---|---|---|
| 3,836,908 | * | 9/1974 | Hegendorfer .......................... 341/152 |
| 5,337,338 | * | 8/1994 | Sutton et al. ......................... 341/53 X |
| 6,147,634 | * | 11/2000 | Rangan et al. ......................... 341/143 |
| 6,148,046 | * | 11/2000 | Hussein et al. ......................... 375/345 |

* cited by examiner

*Primary Examiner*—Howard L. Williams
(74) *Attorney, Agent, or Firm*—Philip Wadsworth; Charles D. Brown; Tom Streeter

(57) ABSTRACT

An interface circuit for converting a digital signal to an analog signal. The interface circuit includes a time response adjustment circuit, a modulator, and a filter. The time response adjustment circuit receives the digital signal and generates an adjusted signal. The modulator couples to the time response adjustment circuit, receives the adjusted signal, and generates a modulator signal. The filter couples to the modulator, receives the modulator signal, and generates the analog signal. The analog signal has a time response that is modified by the time response adjustment circuit. In an embodiment, the time response adjustment circuit includes a gain element, a delay element, and a summer. The gain element receives and scales the digital signal by a scaling factor. The delay element receives and delays the digital signal by a time delay. The summer couples to the gain element and the delay element, sums the scaled signal from the gain element and the delayed signal from the delay element to generate the adjusted signal.

25 Claims, 12 Drawing Sheets

DIGITAL-TO-ANALOG INTERFACE CIRCUIT HAVING ADJUSTABLE TIME RESPONSE

CROSS REFERENCE TO RELATED APPLICATIONS

This application is related to U.S. Application Ser. No. 09/519,734, entitled "TRANSMITTER ARCHITECTURES FOR COMMUNICATIONS SYSTEMS," filed on the same day herewith, Mar. 4, 2000 and incorporated herein by reference.

BACKGROUND OF THE INVENTION

The present invention relates to electronics circuits, and more particularly to an interface circuit that provides an analog signal having an adjustable time response.

A digital-to-analog interface circuit is commonly used in many electronics circuits to provide an analog signal that drives an analog circuit element. The interface circuit typically employs a pulse width modulator (PWM) or a pulse density modulator (PDM) that receives a digital signal from a digital circuit and generates a corresponding intermediate signal that is filtered to provide the analog signal. The PWM or PDM act as an interface between the digital and analog circuits.

A conventional PWM or PDM receives a digital signal comprising a sequence of N-bit digital values and for each value generates a corresponding waveform. Each waveform has a predetermined period and includes a number of high ("1") and low ("0") values, as determined by the input digital value. For example, for a 9-bit PWM or PDM, the input digital value can range from 0 through 511 and each waveform has a period of 512 clock cycles and includes 0 to 511 high values. An input digital value of 128, for example, corresponds to a waveform having 128 high values and 384 low values. For a PWM, the high values are grouped together at the start of each waveform and for a PDM the high values are somewhat randomly spread across the waveform. For ease of implementation, some PDMs spread the high values in a pseudo-random manner, and not uniformly. The waveforms are digital in nature and are filtered to generate the analog signal.

One common application for the interface circuit is in control loops. For example, for a receiver or a transmitter in a communications system, the interface circuit can be used for a carrier tracking loop, a bit timing loop, an automatic gain control (AGC) loop, a bias control loop, a power control loop, a DC offset adjustment loop, and others. For each of these loops, a loop control circuit generates a digital control signal that is provided to a PWM or PDM within the interface circuit associated with that loop. The PWM or PDM generates a sequence of waveforms based on the values in the digital control signal. The waveforms are filtered to generate the analog control signal that is used to drive the controlled element (e.g., a voltage-controlled oscillator, a variable gain amplifier, a summing element, and so on).

The analog control signals generated in conjunction with the PWMs or PDMs are typically required to meet various specifications. Typical specifications include a response time (i.e., the settling time) for a step input and ripple amplitude on the control signal. Fast response time and small amounts of ripple are desirable (or required) for many applications. The fast response time allows for a wide bandwidth control loop and a quick response to rapid changes in the input condition. The ripples on the control signal correspond to noise, and small amounts of ripple are generally required for better performance. However, fast response time and small amounts of ripple are conflicting design considerations. Optimizing for fast response time often results in larger ripple amplitude on the control signal.

As can be seen, an interface circuit having adjustable time response (i.e., to provide a faster response time) while maintaining small ripple amplitude is highly desirable.

SUMMARY OF THE INVENTION

The invention provides a digital-to-analog interface circuit that generates an analog signal having an adjustable time response and introduces minimum additional ripple, if any, on the analog signal. The interface circuit includes a time response adjustment circuit that receives the digital signal, modifies (or adjusts) the digital signal to obtain the desired time response characteristics (i.e., faster response time), and provides the adjusted signal to a subsequent circuit that converts the adjusted signal into the analog signal. For example, to provide a faster response time, the time response adjustment circuit can add overdrive pulses corresponding to changes in the digital signal. The overdrive pulses provide additional drive for the subsequent filter which, in turn, speeds up the filter response.

A specific embodiment of the invention provides an interface circuit for converting a digital signal to an analog signal. The interface circuit includes a time response adjustment circuit, a modulator, and a filter. The time response adjustment circuit receives the digital signal and generates an adjusted signal. The modulator couples to the time response adjustment circuit, receives the adjusted signal, and generates a modulator signal. The filter couples to the modulator, receives the modulator signal, and generates the analog signal. The analog signal has a time response that is modified by the time response adjustment circuit. In an embodiment, the time response adjustment circuit includes a gain element, a delay element, and a summer. The gain element receives and scales the digital signal by a scaling factor. The delay element receives and delays the digital signal by a time delay. The summer couples to the gain element and the delay element. The summer subtracts the delayed signal from the scaled (or gained) signal to generate the adjusted signal.

Another specific embodiment of the invention provides a method for modifying a time response of an analog signal. The method includes: (1) receiving a digital signal; (2) generating an adjusted signal based on the digital signal and changes in the digital signal; (3) generating a modulator signal based on the adjusted signal; and (4) filtering the modulator signal to obtain the analog signal. The analog signal has a time response that is modified based on, for example, changes in magnitude of the digital signal. The modifications manifest in the adjusted signal and may include, for example, overdrive pulses corresponding to changes in the digital signal.

The invention can be used in various applications including, for example, control loops of a receiver or a transmitter.

The foregoing, together with other aspects of this invention, will become more apparent when referring to the following specification, claims, and accompanying drawings.

DESCRIPTION OF THE SPECIFIC EMBODIMENTS

The interface circuit of the invention can be used for various applications to generate analog signals that control or interface to analog circuits. For example, the interface circuit can be used to generate analog control signals that are used in various control loops. The interface circuit can also be used to generate reference voltages, shaped waveforms, and other signals.

Figure 1:
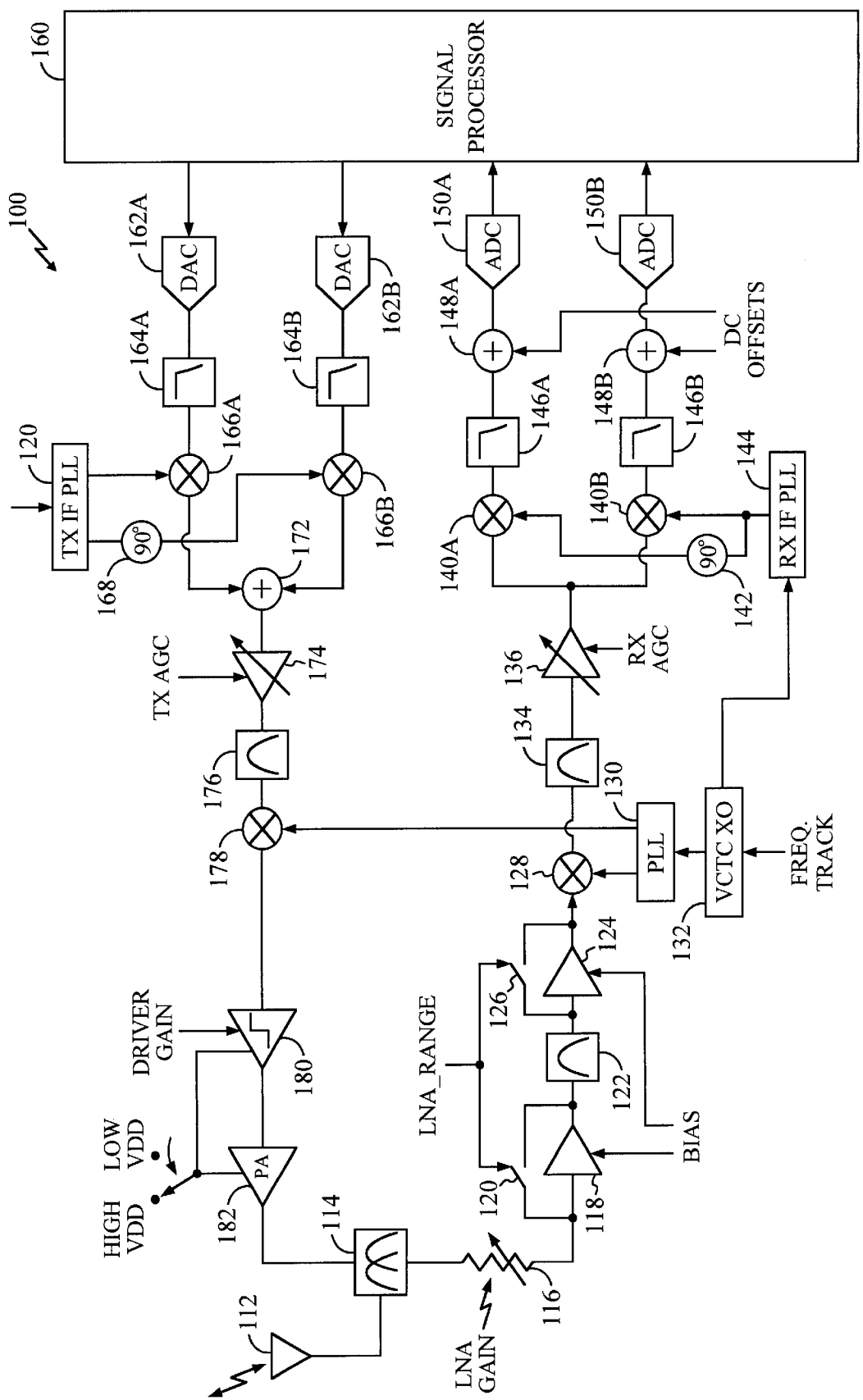
FIG. 1 shows a block diagram of an embodiment of a transceiver for a communications system.

FIG. 1 shows a block diagram of an embodiment of a transceiver 100 for a communications system. The receiver and transmitter shown in FIG. 1 can be used for various applications, including cellular phone, HDTV, cable televisions, and others.

Within the received path, the transmitted signal (i.e., from a base station) is received by an antenna 112, routed through a duplexer 114, attenuated by a variable attenuator 116, and provided to a parallel combination of a low noise amplifier 118 and a switch 120. Depending on the required gain, the signal is either amplified by amplifier 118 or bypassed through switch 120. The signal from the output of amplifier 118 is then filtered by a filter 122 and provided to a second parallel combination of a low noise amplifier 124 and a switch 126. Again, depending on the required gain, the signal is either amplified by amplifier 124 or bypassed through switch 126. The signal from the output of amplifier 124 is then provided to a mixer 128 that downconverts the signal to an intermediate frequency (IF) using a local oscillator (LO) from a phase lock loop (PLL) circuit 130. The local oscillator is phase locked to a reference clock from a voltage-controlled-temperature-compensated crystal oscillator (VCTCXO) 132.

The IF signal from mixer 128 is filtered by a bandpass filter 134, amplified by a variable gain amplifier (VGA) 136, and provided to mixers 140a and 140b. Mixers 140a and 140b downconvert the IF signal with an in-phase sinusoidal from a phase shifter 142 and a quadrature sinusoid from a receiver IF phase lock loop (Rx IF PLL) 144, respectively. The baseband signal from each of mixers 140a and 140b is filtered by a lowpass filter 146, DC offset adjusted by a summer 148, and sampled by an analog-to-digital converter (ADC) 150. The digital samples from ADCs 150a and 150b are provided to a signal processor 160 that processes the samples to generate the output data and the required control signals.

Within the transmit path, the transmit data samples from signal processor 160 are provided to digital-to-analog converters (DACs) 162a and 162b that generate the analog baseband signals corresponding to the data samples. The analog signals from each of DACs 162a and 162b is filtered by a filter 164 and provided to a mixer 166. Mixers 166a and 166b upconvert the filtered baseband signals to IF with the in-phase sinusoidal from a phase shifter 168 and a quadrature sinusoidal from a transmitter IF phase lock loop (Tx IF PLL) 170, respectively. The in-phase signal from mixer 166a and the quadrature signal from mixer 166b are summed by a summer 172. The resultant IF signal is amplified by a variable gain amplifier (VGA) 174, filtered by a filter 176, and upconverted by a mixer 178 with a second local oscillator signal from PLL 130. The radio frequency (RF) signal from mixer 178 is amplified by a driver 180 and further buffered by a power amplifier (PA) 182 that drives antenna 112 via duplexer 114.

FIG. 1 also shows various control loops within transceiver 100. For example, in the receive signal path, one or more gain control loops set the gains of attenuator 116 and VGA 136 (and can select between a bypass or a LNA path), a bias control loop sets the bias current of amplifiers 118 and 124, a frequency tracking loop sets the frequency of VCTCXO 132, and a DC offset loop attempts to null out the DC offset in the filtered signals from filters 146. In a specific implementation, filters 146 are active filters that provide high DC gain and can potentially generate large DC offsets in the filtered signals. The DC offsets loop removes the DC offset generated by filters 146 so that the offset compensated signals are within the input range of ADCs 150a and 150b. In the transmit signal path, a gain control loop sets the gain of VGA 174. Other transceiver implementations may include greater, fewer, or different control loops than that shown in FIG. 1.

As an example, consider the AGC loop that sets the gain of VGA 136 within the receive signal path to maintain the signal level for improved signal-to-noise (SNR) performance. If the received signal is too high, the AGC loop reduces the VGA gain. Alternatively, if the received signal is too low, the AGC loop increased the VGA gain. The AGC loop adjusts the "desired" signal level (i.e., not the jammer signal level) such that it is approximately constant at the input of the ADCs. Otherwise, too high of a signal level would cause clipping by the ADCs and too low of a signal level would increase the noise level, both of which would result in reduction of SNR.

The control sections of the control loops are typically implemented within digital circuits (i.e., within signal processor 160). The digital control signals from the loop control circuits are then provided to interface circuits that generate the corresponding analog control signals used to drive the various elements shown in FIG. 1. Loop control theory and implementation of the loop control circuits are known in the art and not described herein.

Each transceiver design imposes a particular set of requirements on the performance of the interface circuits. These requirements typically include the response time and the amount of ripple on each of the control signals. For example, the bandwidth of the interface circuit generally needs to be much wider (i.e., three to ten times wider) than the closed loop bandwidth of the control loop. This is needed so that the interface circuit does not add excessive phase to the control loop and distort the loop response. Moreover, the ripples in the control signal behave as noise that degrades the performance of the control loop. The ripples need to be reduced to a predetermined amplitude that is defined by the requirement of the particular loop.

Figure 2A:
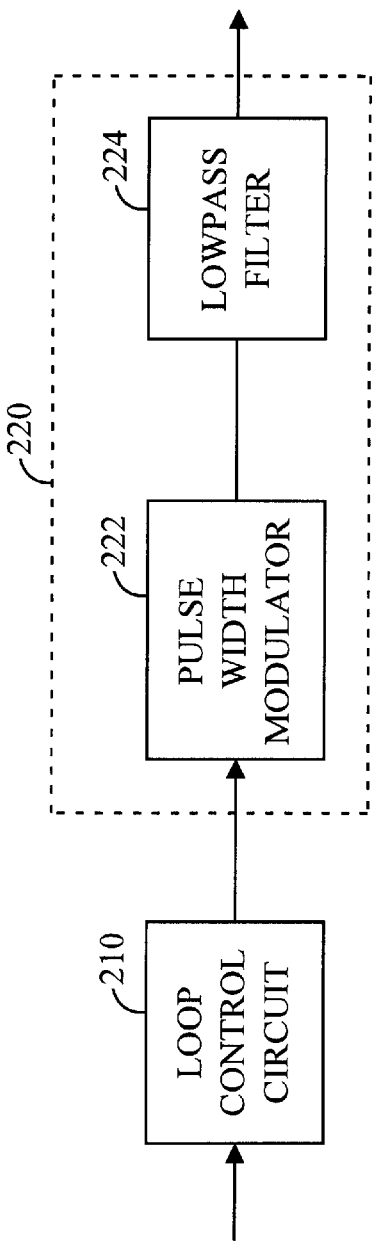
FIGS. 2A and 2B show block diagrams of a portion of a conventional control loop and a portion of a control loop that includes an interface circuit of the invention, respectively.

FIG. 2A shows a block diagram of a portion of a conventional control loop. A loop control circuit 210 generates a digital signal that is provided to an interface circuit 220. Within interface circuit 220, a pulse width modulator (PWM) or a "conventional" PDM 222 receives the digital signal and generates a sequence of waveforms corresponding to the values in the digital signal. A lowpass filter 224 receives and filters the waveforms to provide an analog control signal. Loop control circuit 210 in FIG. 2A can be the loop control circuit for any of the loops shown in FIG. 1 and described above.

Interface circuit 220 exhibits several disadvantages associated with conventional PWMs and PDMs. For each digital value in the digital signal, the PWM generates a particular waveform corresponding to that digital value. For a N-bit PWM, $2^N$ clock cycles are required to represent a N-bit value, resulting in PWM waveforms having a period of $2^N$ clock cycles. The number of high ("1") and low ("0") values for each waveform is determined by the input digital value. The high values from the PWM are typically grouped together. For example, a digital value of 128 corresponds to a PWM waveform that is high for the first 128 out of 512 clock cycles. This implementation results in an analog signal having a periodicity corresponding to the period of the PWM waveform, or a periodicity of $2^N$ clock cycles.

An important characteristic of pulse width and pulse density modulators is that the minimal amount of ripple occurs when the high values are uniformly spaced within the waveform. This is because the capacitor in the filter coupled to the modulator output would then have the same amount of time to charge and discharge each set of high and low values. When the high values are uniformly spaced, the overall minimum in the resulting voltage occurs just before the transition from low to high and the overall maximum occurs just before the high to low transition, resulting in a minimum amount of ripple at steady state. When the high values are not uniformly spaced, the capacitor would have asymmetric charge and discharge times, resulting in an increased steady state ripple amplitude.

Figure 2B:
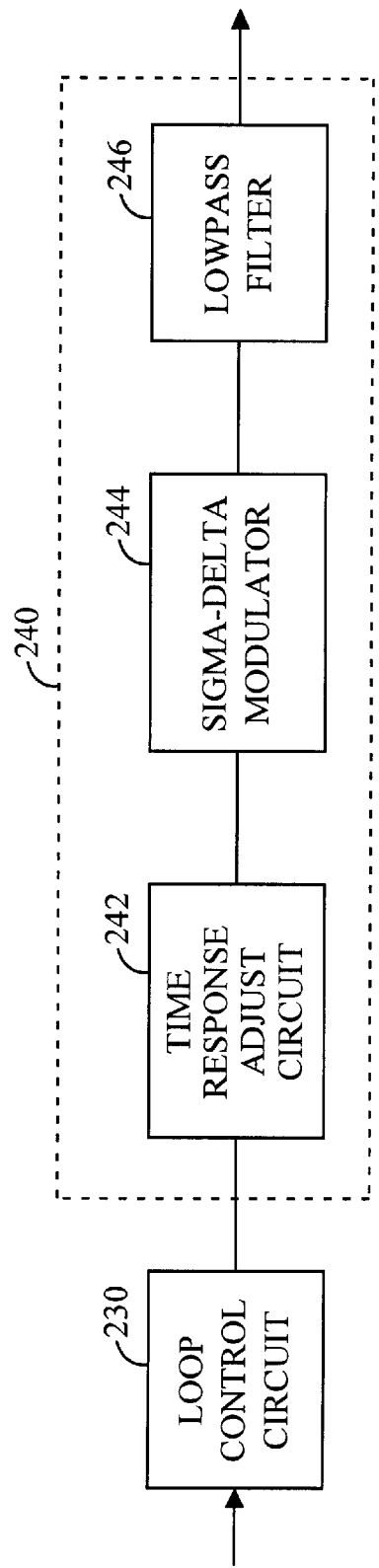

FIG. 2B shows a block diagram of a portion of a control loop that includes an interface circuit of the invention. A loop control circuit 230 generates a digital signal that is provided to an interface circuit 240. Within interface circuit 240, a time response adjustment circuit 242 receives the digital signal and generates an "adjusted" signal having an adjusted time response, as will be described below. A sigma-delta modulator 244 receives the adjusted signal and generates a modulator signal that comprises a sequence of waveforms corresponding to the values in the adjusted signal. A lowpass filter 246 receives and filters the waveforms to provide an analog signal.

To reduce cost and minimize the number of components required to implement the interface circuit, some elements of the interface circuit are implemented in digital hardware (i.e., within signal processor 160) and some are implemented using analog components. Since the circuit elements to be controlled are typically analog in nature, the analog components provide the required signal conditioning to generate an analog signal from a digital signal. In an implementation, time response adjustment circuit 242 and sigma-delta modulator 244 are integrated within a digital IC that also provides other functionality required by the system.

Figure 3A:
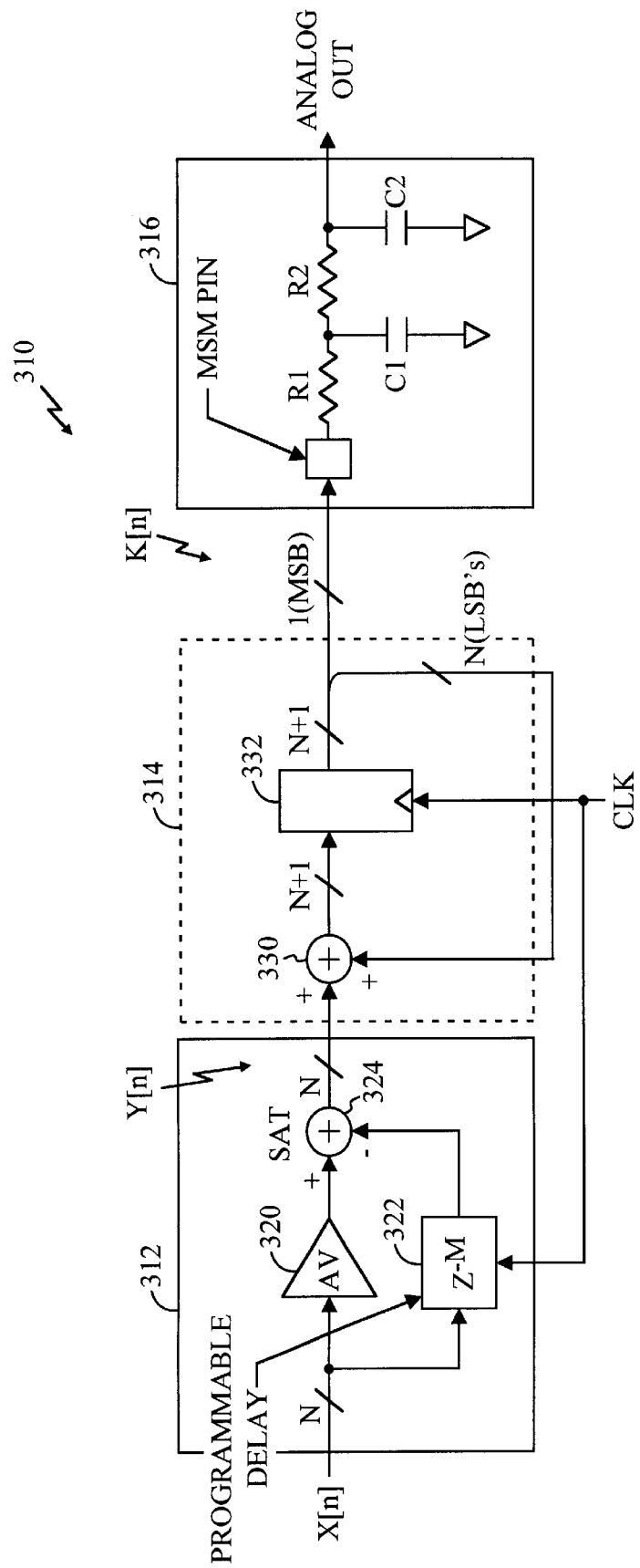
FIG. 3A shows a diagram of a specific embodiment of an interface circuit of the invention.

FIG. 3A shows a diagram of a specific embodiment of an interface circuit 310 of the invention. Interface circuit 310 includes a time response adjustment circuit 312, a first order sigma-delta modulator 314, and a second order lowpass filter 316. The digital signal is provided to time response adjustment circuit 312 that generates an adjusted signal. In an embodiment, the adjusted signal includes modifications to the digital signal that provide a faster or modified response time.

Within time response adjustment circuit 312, the digital signal x[n] is provided to a gain element 320 and a delay element 322. Gain element 320 scales the digital signal by a scaling factor (Av) that can be fixed or programmable. In a specific embodiment, the scaling factor is two. Delay element 322 delays the digital signal by a time period that can also be fixed or programmable. The scaling factor and the amount of delay are dependent on the requirements of the particular application in which interface circuit is used. The scaled signal from gain element 320 and the delayed signal from delay element 322 are provided to a summer 324 that subtracts the delayed signal from the scaled signal. In an embodiment, summer 324 is a saturation summer that limits the output to N-bit values, which fall within the input range of the subsequent sigma-delta modulator 314. The adjusted signal y[n] from summer 324 is provided to sigma-delta modulator 314.

Within sigma-delta modulator 314, the adjusted signal is provided to a summer 330 that adds the adjusted signal with the N least significant bits (LSBs) from a register 332. The (N+1)-bit output from summer 330 is provided to and stored by register 332. The most significant bit (MSB) from register 332 comprises the modulator signal k[n] that is provided to filter 316. As shown in the embodiment in FIG. 3A, both delay element 322 and register 332 are clocked by the same clock signal (CLK).

Filter 316 filters the modulator signal from modulator 314 to generate the analog signal. In the embodiment shown in FIG. 3A, filter 316 is a second order lowpass filter comprising two resistors and two capacitors.

Figure 3B:
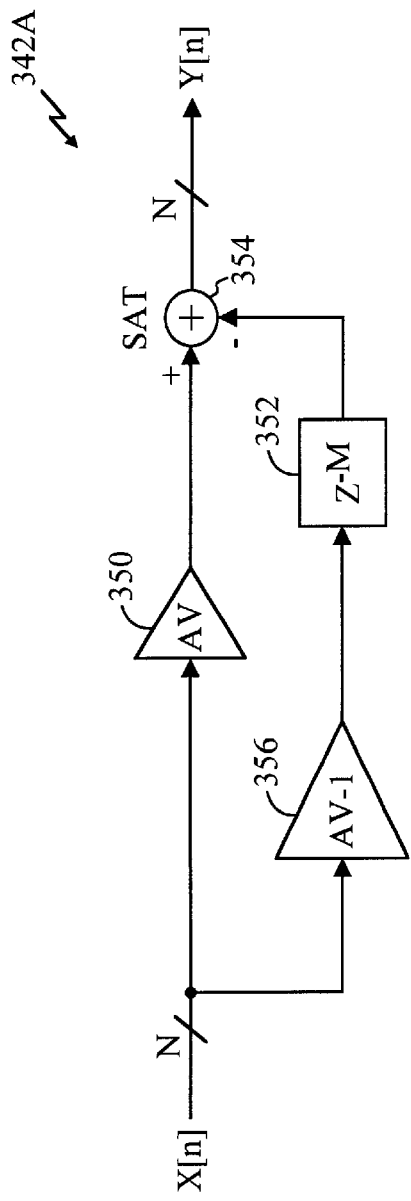
FIGS. 3B and 3C show diagrams of two specific embodiments of the time response adjustment circuit.

FIG. 3B shows a diagram of another specific embodiment of a time response adjustment circuit 342a. Interface circuit 342a includes a gain element 350, a delay element 352, and a summer 354 that correspond to gain element 320, delay element 322, and summer 324 of interface circuit 312 in FIG. 3A. Interface circuit 342a further includes a second gain element 356 having a gain of (Av−1) and coupled between the circuit input and delay element 352. Gain element 356 provides the proper gain such that the adjusted signal y[n] from summer 354 is equal to the digital signal x[n] after the delay period $M \cdot T_s$ provided by delay element 352.

Figure 3C:
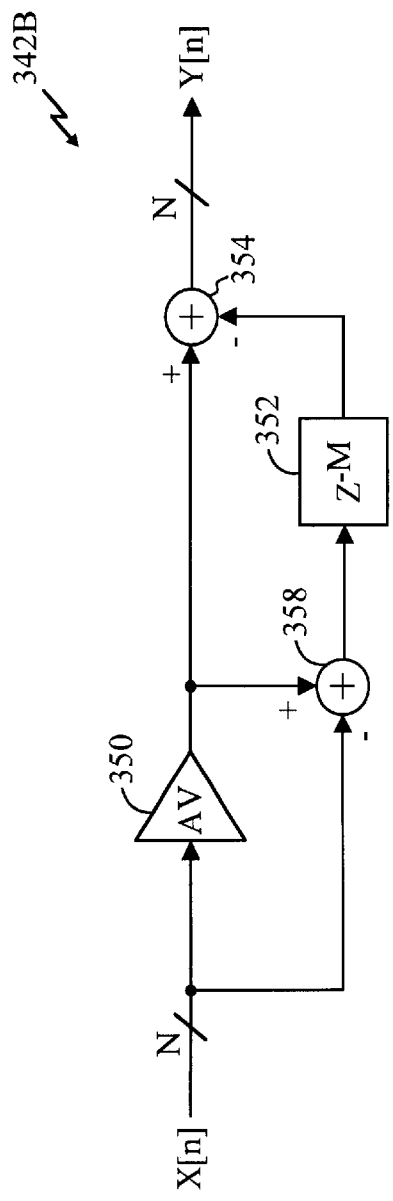

FIG. 3C shows a diagram of yet another specific embodiment of a time response adjustment circuit 342b. Interface circuit 342b includes gain element 350, delay element 352, and summer 354 of FIG. 3B. Interface circuit 342b further includes a second summer 358 having an non-inverting input coupled to the output of gain element 350 and an inverting input coupled to the circuit input. Interface circuit 342b provides the same transfer function as that of FIG. 3B.

Time Response Adjustment Circuit

The waveforms from a PWM, PDM, or sigma-delta modulator are digital in nature and are filtered by an analog filter to provide the desired analog signal. Conventionally, the step response of the analog signal due to a step change in the digital signal is determined by the analog filter. A filter having a wide bandwidth provides a faster response time but results in larger ripple amplitude in the analog signal. Thus, the filter is typically set at the highest possible bandwidth that results in an acceptable ripple amplitude (i.e., meeting the ripple specification). The response time associated with this filter bandwidth then represents the fastest possible response time achievable by the interface circuit.

For some applications, such as control loops having wide loop bandwidths, the response time achieved with conventional interface circuits is not acceptable. For example, referring to FIG. 1, driver 180 in the transmit AGC loop is controlled by a digital signal having fast transition time. As driver 180 is switched between a low gain state and a high gain state, the gain in the signal path changes and needs to be compensated by adjusting the gain of VGA 174. If the Tx AGC control signal has a slow response time (i.e., because of the limitations imposed by the analog filter providing this control signal), then the response times of driver 180 and VGA 174 are not "matched". The mismatch results in a bump in the signal gain when the gain of driver 180 is switched.

Figure 4A:
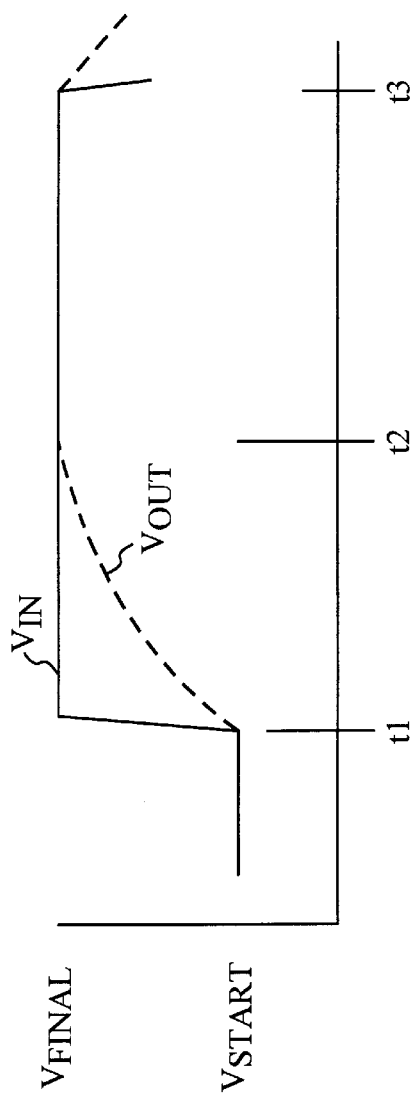
FIGS. 4A and 4B show plots of step responses of a conventional interface circuit and an interface circuit that employs a time response adjustment circuit of the invention, respectively.

FIG. 4A shows a plot of a step response of a conventional interface circuit. The digital signal transitions from a starting value to a final value at a time $t_1$. The output of the filter, in response, begins transitioning from the starting value ($V_{start}$) shortly after $t_1$ and asymtotically approaches ($V_{final}$). At a time $t_3$, the digital signal again changes and the filter then responds accordingly.

Figure 5:
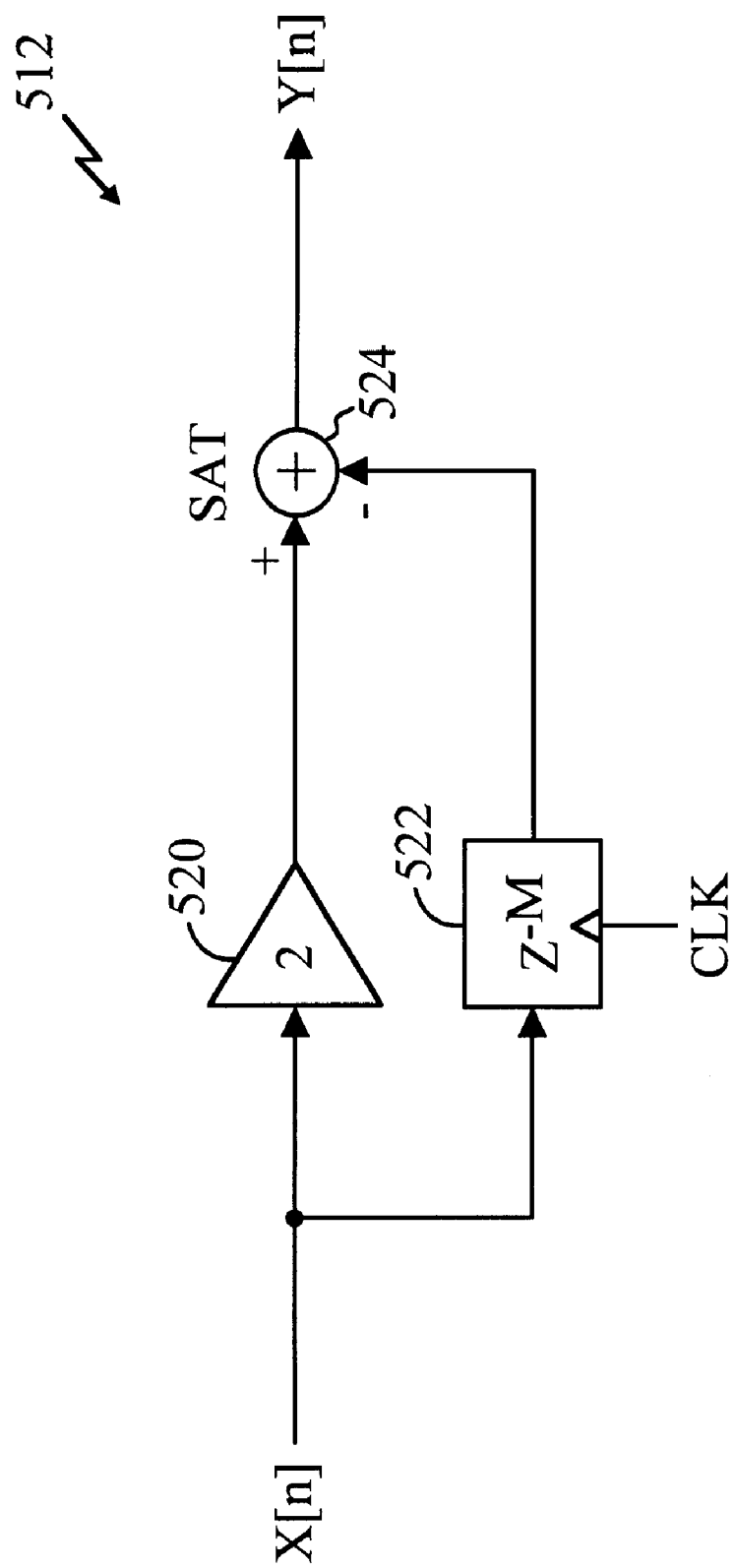
FIG. 5 shows a diagram of a specific embodiment of a time response adjustment circuit of the invention.

FIG. 5 shows a diagram of a specific embodiment of a time response adjustment circuit 512 of the invention. For a particular filter, the response time can be increased (or made faster) by temporarily overdriving the modulator with a signal (or a pulse) generated by the time response adjustment circuit. Within time response adjustment circuit 512, the digital signal is provided to a gain element 520 and a delay element 522. In the embodiment shown in FIG. 5, gain element 520 scales the digital signal x[n] by a scaling factor of two and delay element 522 delays the digital signal by M cycles of the clock signal (CLK). The scaling factor and the delay period can also be made programmable. The scaled signal from gain element 520 and the delayed signal from delay element 522 are provided to a saturation summer 524 that subtracts the delayed signal from the scaled signal. Summer 524 limits the adjusted signal y[n] to N-bit values.

In a specific embodiment, the digital signal x[n] is in unsigned binary (i.e., having a range of 0 to 512 for a 9-bit implementation). In another specific embodiment, the digital signal x[n] is in two's complement (i.e., having a range of −256 to 255 for a 9-bit implementation). The digital signal x[n] changes at a much slower rate than the clock signal (CLK) used to clock the delay element and the subsequent modulator. For example, for a 9-bit modulator the digital signal changes at 1/512 the rate of the clock signal, or slower.

Time response adjustment circuit 512 operates in the following manner. For a predetermined delay period of $M \cdot T_s$, where M is the number of clock cycles of delay and $T_s$ is the period of the clock signal (CLK), the adjusted signal y[n] from time response adjustment circuit 512 is:

$$y[n]=2x[n]-x[n-M], \qquad \text{Eq(1)}$$

or $$y[n]=x[n]+(x[n]-x[n-M]), \qquad \text{Eq(2)}$$

where x[n−M] is the digital signal delayed by M clock periods. For a particular n, y[n] is greater than or equal to x[n]. In fact, y[n] is (x[n]−x[n−M]) greater than the current digital value of x[n] during this delay period. At the conclusion of the delay period, once the current digital value of x[n] is provided from delay element 522, the output from summer 524 becomes y[n]=x[n]. Response time adjust circuit 512 thus generates an "overdrive" pulse train p[n] having the same amplitude as the step change (i.e., p[n]= Δx[n]=x[n]−x[n−M]). Each overdrive pulse has a duration of $M \cdot T_s$ that is determined by the delay element.

The filter coupled to the time response adjustment circuit via the modulator responds to the difference between the current and the previous input value (i.e., y[n]−y[n−1]). Time response adjustment circuit 512 effectively doubles the filter drive during the delay period from (y[n]−y[n−1])=(x[n]−x[n−1]) to (y[n]−y[n−1])=2·(x[n]−x[n−1]). This higher y[n]results in more drive to the filter, which speeds up the response time. At the conclusion of the delay period, after $M \cdot T_s$ time, time response adjustment circuit 512 has no effect on the input digital value and y[n] becomes x[n].

Figure 4B:
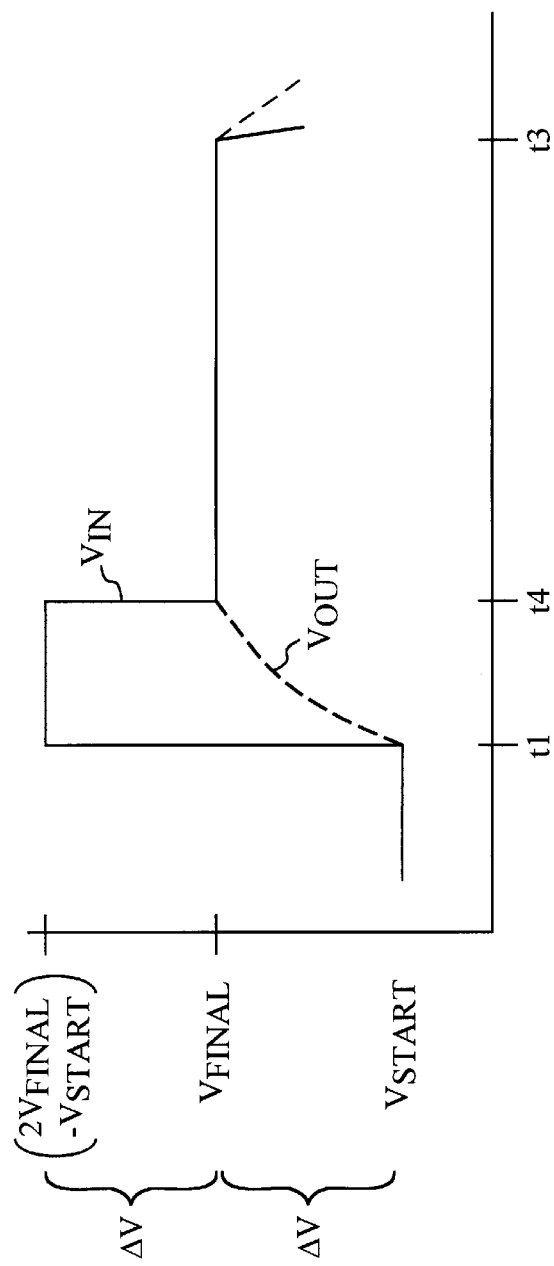

FIG. 4B shows a plot of a step response of an interface circuit that employs time response adjustment circuit 512. Initially, the adjusted signal transitions from a starting value to a new value at time $t_1$. However, as shown in FIG. 4B, the modulator is overdriven by time response adjustment circuit 512 to an adjusted value corresponding to ($2V_{final}-V_{start}$), which is twice the change of the digital signal x[n−M]. The analog signal from the filter, shortly after $t_1$, begins transitioning from the starting value ($V_{start}$) toward ($2V_{final}-V_{start}$) and reaches $V_{final}$ at a faster rate. As the analog signal approaches $V_{final}$ at time $t_4$, the overdrive pulse is removed and the adjusted signal returns to a value corresponding to $V_{final}$. The filter then transitions to its final value $V_{final}$. As shown in FIG. 4B, the overdrive pulse has an amplitude equal to the change in input value ($\Delta V = V_{final} - V_{start}$) and a duration of ($t_4 - t_1$).

For some changes in the input digital signal, the amplitude of the overdrive pulse is the same as the change in the digital signal (i.e., p[n]=Δx[n]=x[n]−x[n−M]), as shown in FIG. 4B. This result occurs when there is adequate headroom from the current digital value to provide an overdrive pulse having an amplitude of (p[n]=Δx[n]). Specifically, if (x[n−M]+2Δx[n]) falls within the input range of the modulator, then the amplitude of the overdrive pulse is equal to the step change. For all changes in the digital signal that meet this condition, the amount of improvement in the response time is (theoretically) the same.

However, because of the saturation performed by summer 524 to maintain the adjusted signal y[n] within the valid input range of the subsequent circuit (e.g., the sigma-delta modulator), the amplitude of the overdrive pulse is less than Δx[n] for some changes in the digital signal. This occurs when there is inadequate headroom from the current value of x[n] to provide an overdrive pulse having an amplitude of Δx[n]. The overdrive pulse is then clipped by an amount related to the available headroom. When the pulse amplitude is clipped, the response time is not as fast as when the pulse amplitude is not clipped. To further improve (i.e., speed up)

the response time, the duration of the overdrive pulse can then be increased. In an embodiment, the duration of the overdrive pulse is increased (from the nominal pulse duration of M) in accordance with the amount of clipping. For example, a pulse that is clipped by half (i.e., p[n]=0.5·Δx[n]) would have a longer duration than that of a pulse that is clipped by a quarter (i.e., p[n]=0.75·Δx[n]).

Figure 8A:
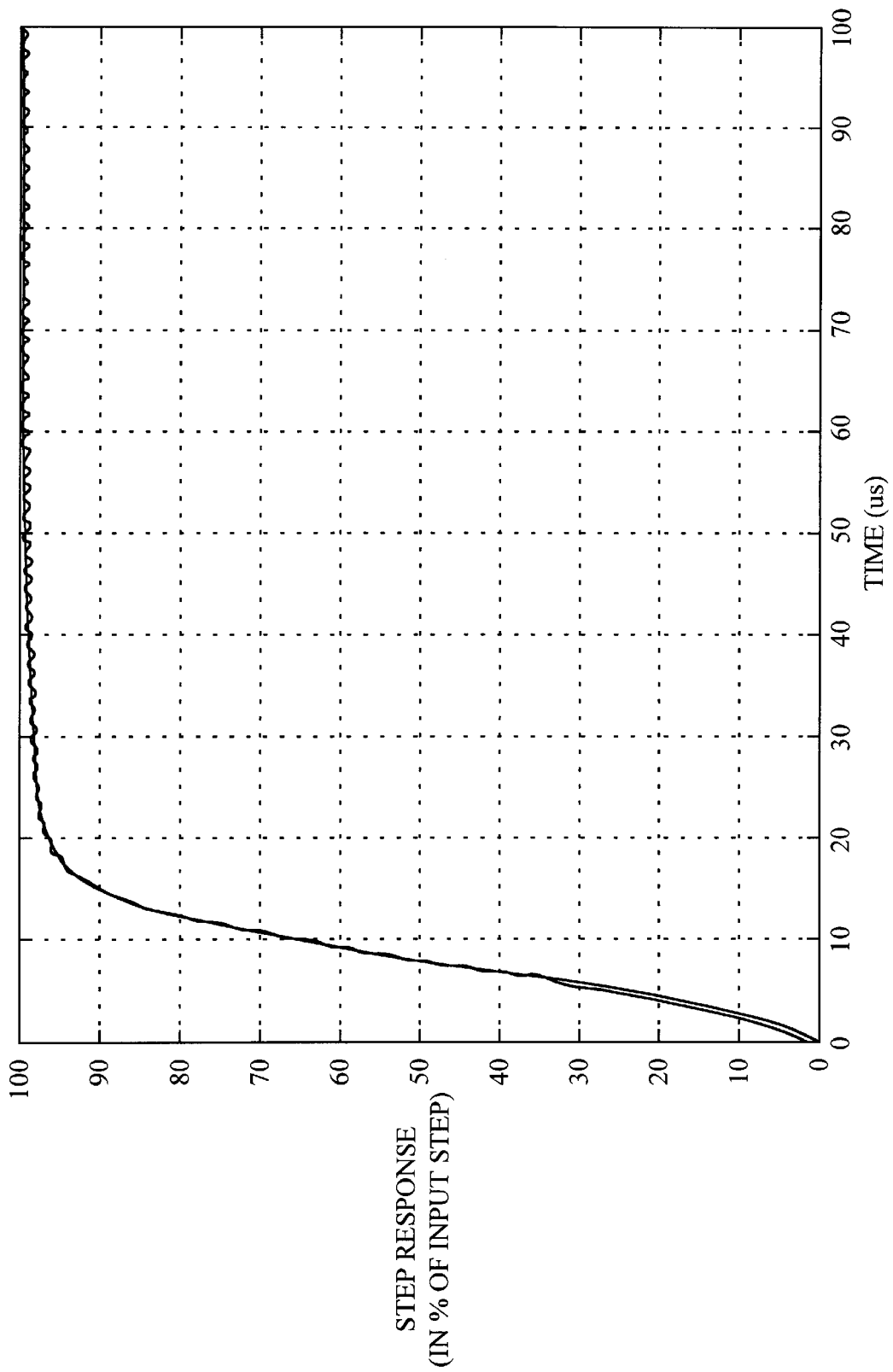
FIGS. 8A and 8B show plots of the step responses for a case when the overdrive pulse is not clipped and a case when the overdrive pulse is clipped.
Figure 8B:
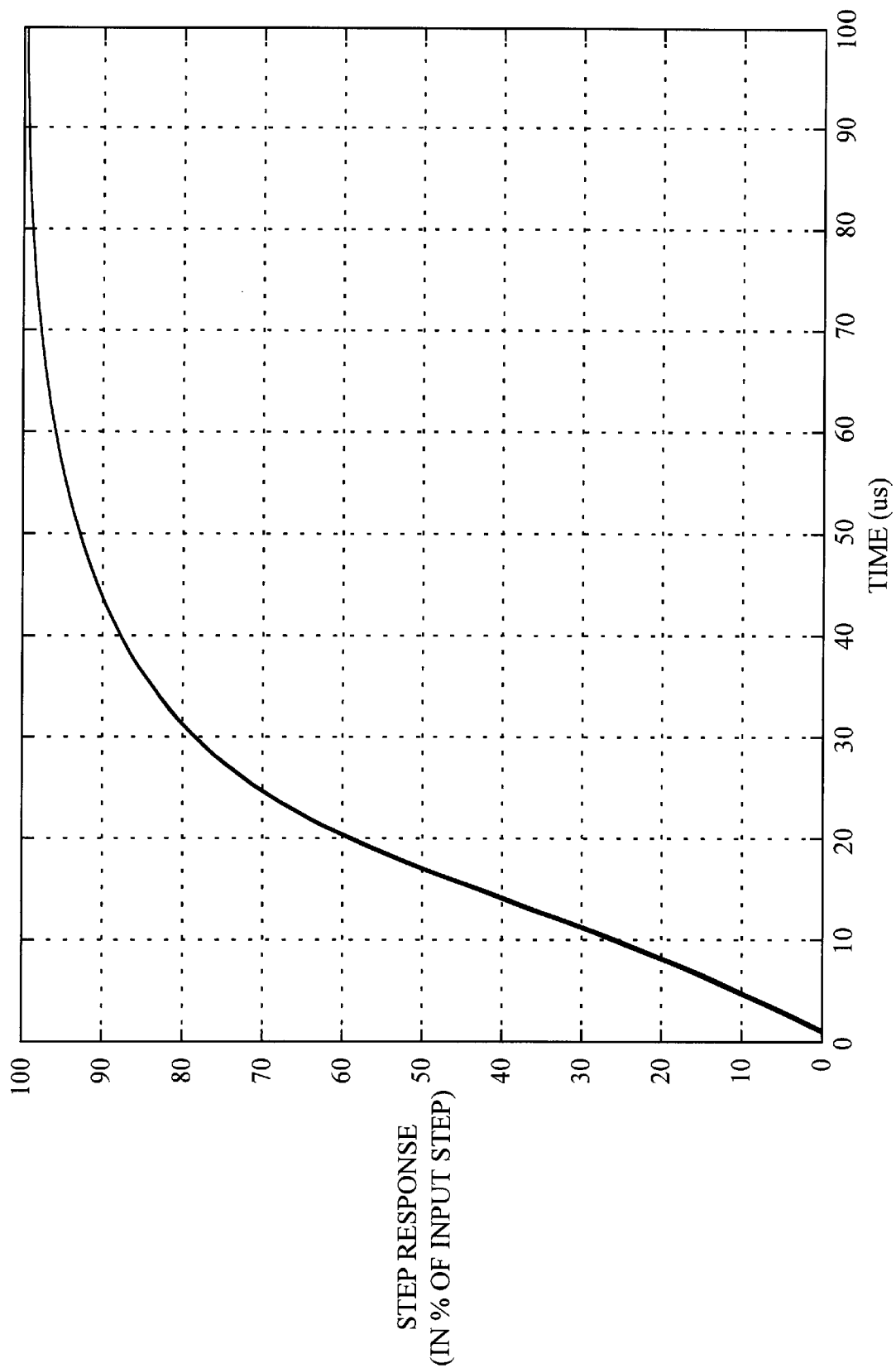

FIGS. 8A and 8B show the effects of clipping on the step response in the analog signal. FIG. 8A shows a plot of the step response for a case when the overdrive pulse is not clipped and FIG. 8B shows a plot of the step response for a case when the overdrive pulse is clipped. For the specific implementation corresponding to FIG. 8A, when the overdrive pulse is not clipped, the duration of the overdrive pulse is 112 chip×8 or 11.4 µsec, and the step response time to 70% of final value is approximately 10 µsec. For the same implementation, when the overdrive pulse is clipped by 100 percent (i.e., no overdrive pulse is provided), the step response time to 70% of final value is approximately 24 µsec. As noted above, the step response time can be improved by increasing the duration of the overdrive pulse when clipping occurs.

As shown in FIGS. 3 and 5, the response time can be controlled by adjusting the gain of the gain element or the delay of the delay element, or both. For a particular gain, if the delay is too short, a shorter overdrive pulse is generated and the time response adjustment circuit has less impact on the response time. When the delay is zero (M=0), the output of the time response adjustment circuit is simply x[n] and has no impact. To speed up the response time, the delay is increased as much as possible. However, if the delay is made too long, too much overdrive may cause the analog signal to overshoot the final value, which may be an undesirable result for many applications. The delay that results in the fastest possible response time without overshoot can be determine empirically, by simulation, or by calculation.

Similarly, for a particular delay period M·$T_s$, if the gain of the gain element is small (i.e., close to one), a smaller overdrive pulse is generated and the time response adjustment circuit has less impact on the response time. When the gain is set to one, the time response adjustment circuit has no impact on the response time.

In an embodiment, the gain element and the delay element are both programmable. In another embodiment, the gain delay is adjusted based on the amount of change in the digital signal. For example, a higher gain or a longer delay, or both, is used for a large change and a lower gain or a shorter delay, or both, is used for a smaller change. In yet another embodiment, each change in the input digital signal can be associated with a set of programmed gain and delay values that results in the fastest response time without overshoot.

FIGS. 3 and 5 show one embodiment of the time response adjustment circuit of the invention. The time response adjustment circuit can be implemented with digital circuit. The time response adjustment circuit can also be implemented with a memory element such as a random access memory (RAM) or a read only access memory (ROM). For a particular change in digital value, the memory element provides a sequence of values that provides the desired time response characteristics (i.e., the fastest response time without overshoot).

Although the time response adjustment mechanism of the invention has been described as being implemented using digital circuit, the invention can also be implemented in software or microcode that is executed by a processor (i.e., signal processor 160). Also, the time response adjustment mechanism has been described for a specific application in which an overdrive pulse is generated to obtain faster response time. The time response adjustment mechanism of the invention can be used for other applications, such as to "waveshape" the time response to achieve a particular waveform characteristic. Thus, the time response adjustment mechanism of the invention is intended to cover any and all modifications to the time response characteristics of the analog signal as generated by a conventional modulator and filter combination.

Sigma-Delta Modulator

The sigma-delta modulator provides a modulator signal k[n] comprising a sequence of high and low values (i.e., a sequence of output waveforms) corresponding to the adjusted signal y[n] at its input. The high values are uniformly distributed in the output waveforms. This characteristic results in smaller ripple amplitude because the capacitor in the filter coupled to the modulator would have the same amount of time to charge and discharge each set of high and low values.

Figure 6:
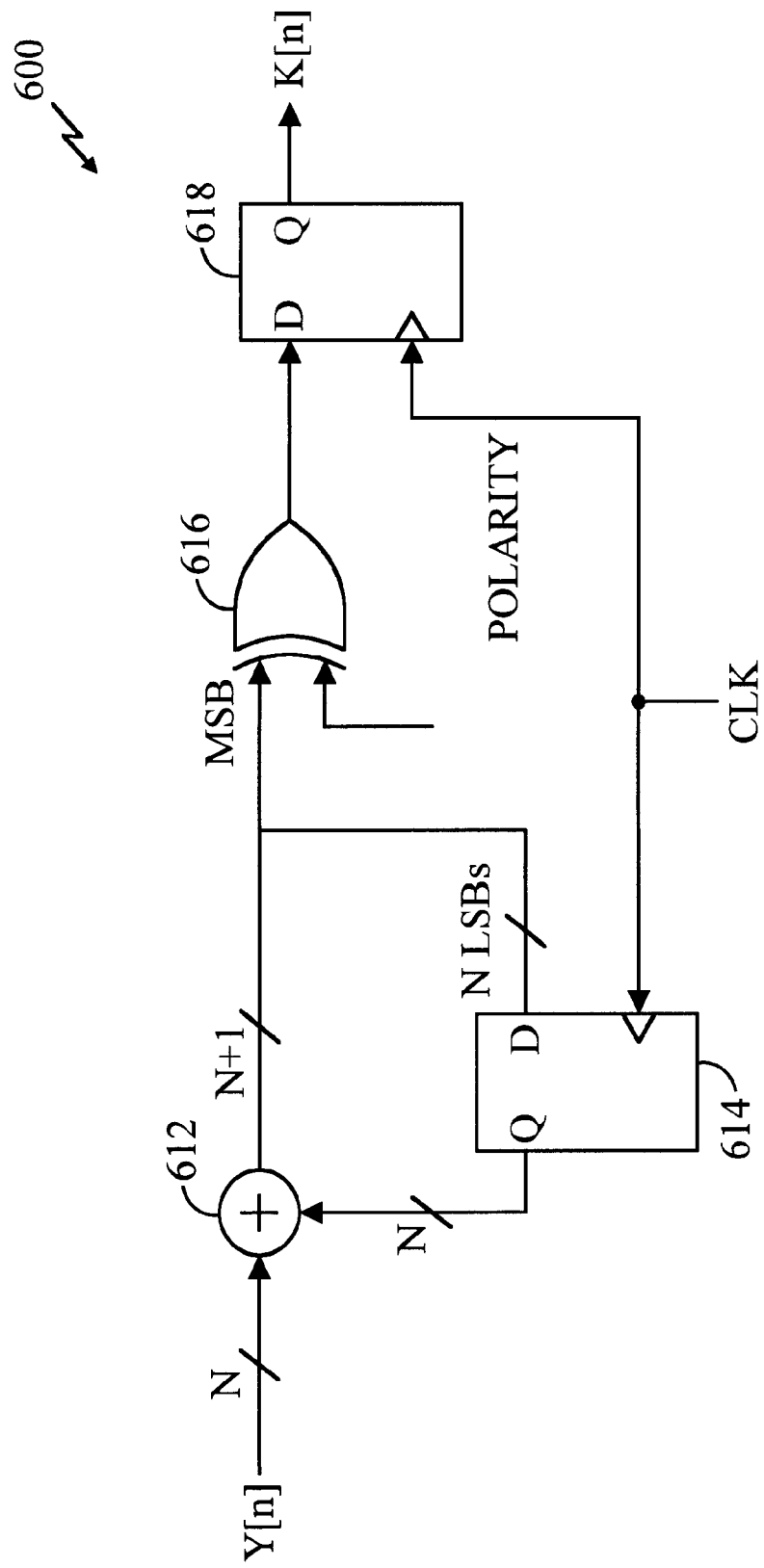
FIG. 6 shows a diagram of a specific embodiment of a first order sigma-delta modulator.

FIG. 6 shows a specific embodiment of a first order sigma-delta modulator 600. The N-bit adjusted signal y[n] is provided to a summer 612 that sums this signal with the N least significant bits (LSBs) from a register 614. The most significant bit (MSB) from adder 612 is provided to a first input of an exclusive-OR. (XOR) gate 616 and the N LSBs from adder 612 are provided to and stored by register 614. A polarity control signal (Polarity) is provided to a second input of XOR gate 616. XOR gate 616 toggles the polarity of the MSB from summer 612 depending on the state of the polarity control signal (e.g., high=toggle and low=no toggle). The output from XOR gate 616 is provided to a register 618 that synchronizes the output with the clock signal (CLK). The output from register 618 comprises the modulator signal from sigma-delta modulator 600.

Sigma-delta modulator 600 uniformly distributes the spacing between the high values to provide improved steady state ripple performance over that of conventional PDMs. Analysis indicates that sigma-delta modulator 600, with nine bits of resolution (N=9), can reduce the worse case peak-to-peak ripple amplitude by a factor of approximately three.

Sigma-delta modulator 600, in addition to spreading the ripple energy uniformly in frequency by oversampling, also noise shapes the ripple energy by utilizing feedback. Through noise shaping, a large portion of the ripple energy is moved to higher frequencies and filtered by the subsequent filter, thereby resulting in less ripple in the unfiltered lower frequencies of interest. Noise shaping by sigma-delta modulator 600 is shown by the following expression:

$$K(z)=z^{-1}Y(z)+(1-z^{-1})E_Q(z), \quad\quad\quad Eq(3)$$

where Y(z), K(z), and $E_Q(z)$ are the z-transforms of the modulator input, the modulator output, and the quantization error, respectively. The modulator transfer function ($H_Y(z)=K(z)/Y(z)$) is given by:

$$H_Y(z)=z^{-1}, \quad\quad\quad Eq(4)$$

and the quantization error function ($H_E(z)=K(z)/E_Q(z)$) is given by:

$$H_E(z)=(1-z^{-1}) \quad\quad\quad Eq(5)$$

Since $z^{-1}$ becomes 1 at DC frequency and −1 at $f_{CLK}/2$, the quantization error function $H_E(z)$ provides zero gain (or infinite attenuation) at DC frequency, large attenuation at lower frequencies, and relative amplification at higher frequencies. The quantization noise is effectively moved from lower frequencies to higher frequencies where filtering is more easily achieved.

A single order sigma-delta modulator outputs a particular waveform for each valid input digital value. Each waveform has a particular ripple characteristic based on the placement of the high and low values in the waveform.

Figure 8C:
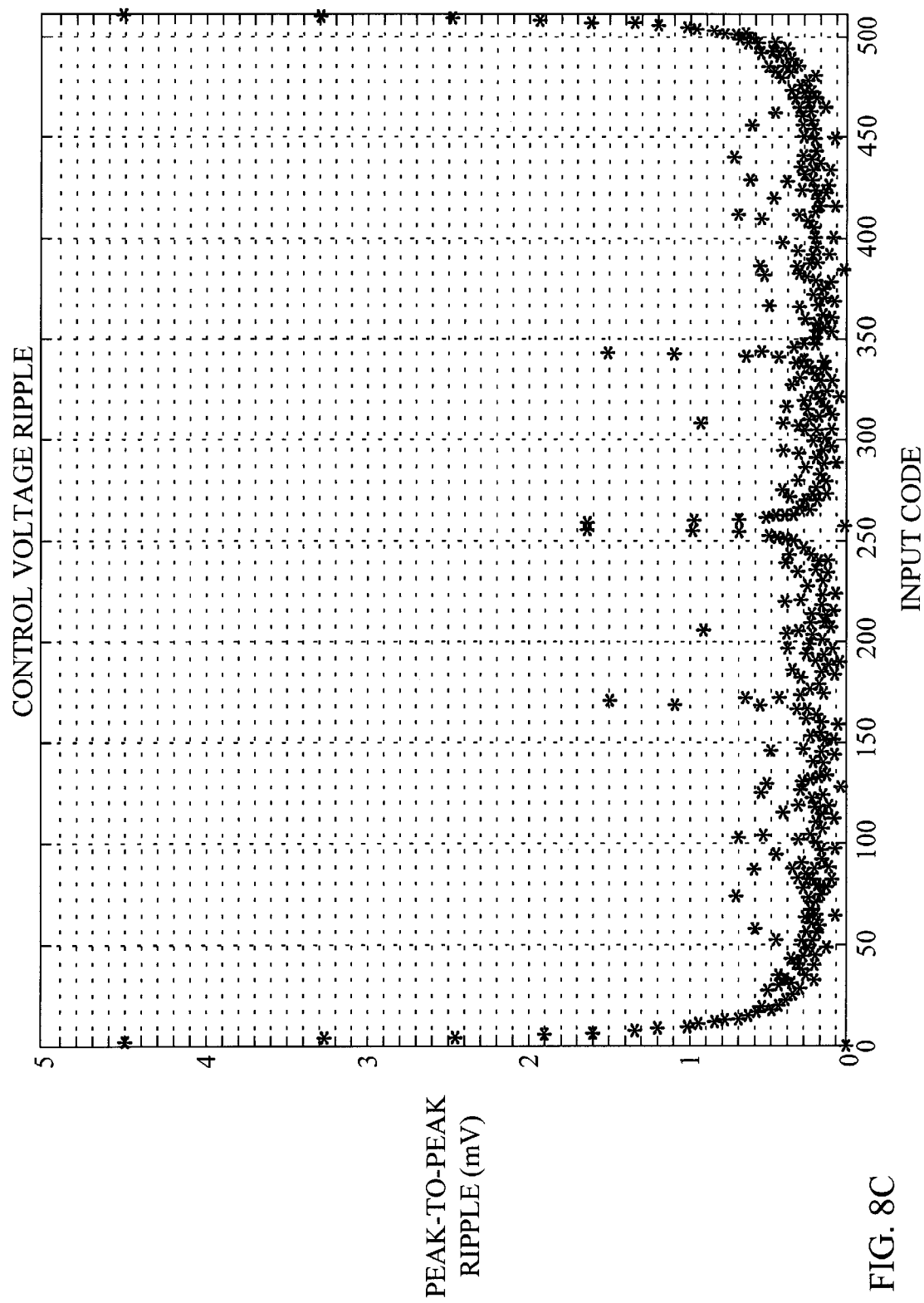
FIGS. 8C and 8D show plots of the peak-to-peak ripple amplitude for all possible input digital values for two specific interface circuit implementations.
Figure 8D:
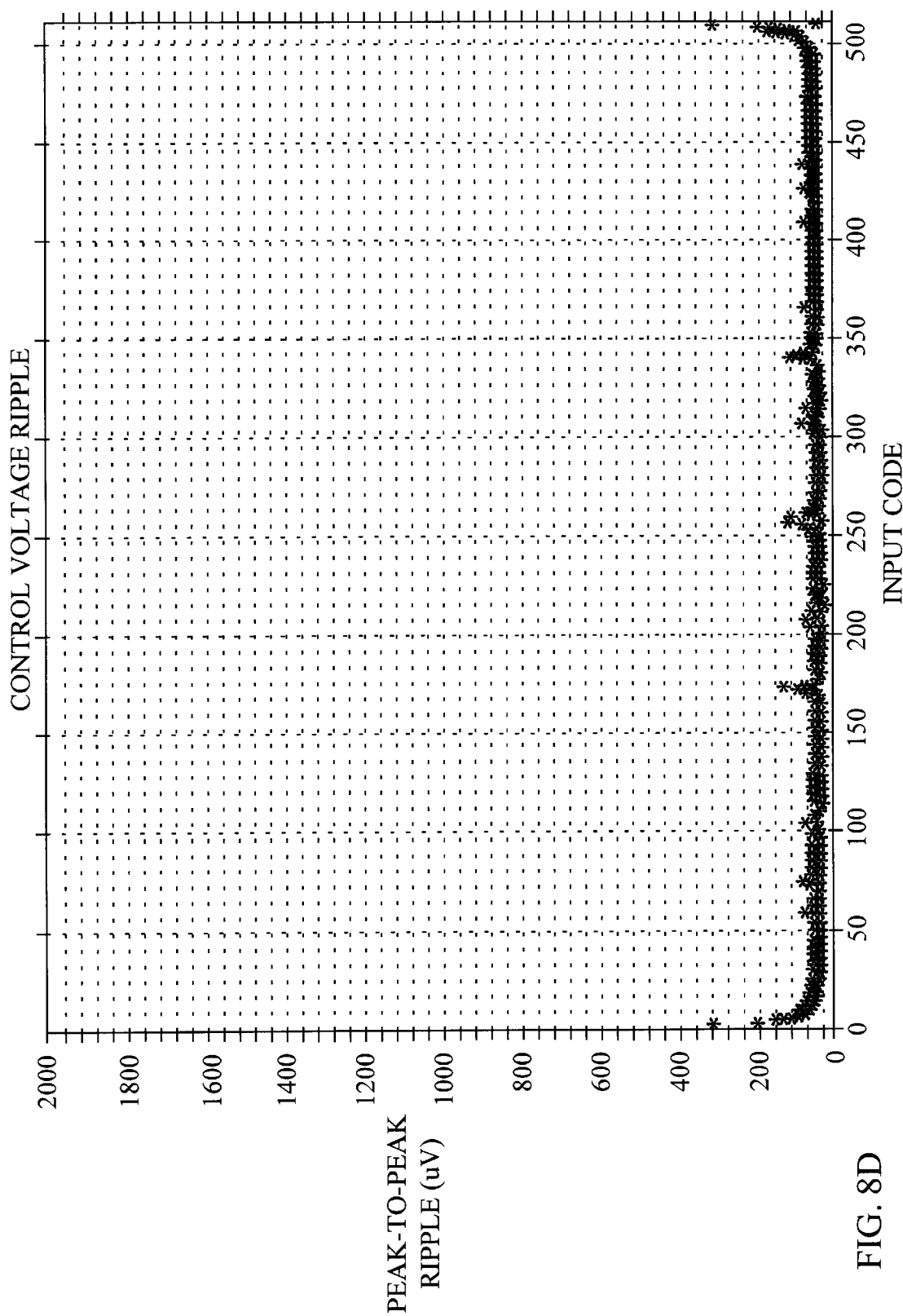

FIGS. 8C and 8D show plots of the peak-to-peak ripple amplitude for all possible input digital values for two specific interface circuit implementations. As shown in FIG. 8C, the sigma-delta modulator has 9 bits of resolution. It can be noted that the ripple amplitude varies depending the input digital value, and is higher near the extreme values of 0 and 511. For input values of 5 through 508, the worse case ripple amplitude is 1.7 mV in FIG. 8C. The ripple amplitude can be reduced by providing additional filtering (i.e., lowering the bandwidth of the filter coupled to the sigma-delta modulator). For the same interface circuit implementation as for FIG. 8C, when the filter bandwidth is reduced by shifting the poles from $p_1$=9.33 kHz and $p_2$=54.34 kHz down to $p_1$=624 Hz and $p_2$=32.48 kHz, the worse case ripple amplitude decreases to 300 $\mu V$.

The ripple performance is a function of the type of modulator, the bandwidth of the lowpass filter, and also the speed of the modulator clock. It can be shown that the amount of ripple in the analog signal from a second order RC-RC filter, for ripples of less than 100% of one LSB, follows the following relationship:

$$\text{ripple as \% of step size} \approx 480\% \cdot \left(\frac{2^N \cdot f_c}{f_{CLK}}\right)^2, \quad \text{Eq (6)}$$

or equivalently, $$\text{ripple as \% of full scale} \approx 480\% \cdot 2^N \left(\frac{f_c}{f_{CLK}}\right)^2, \quad \text{Eq (7)}$$

where $f_c$ is the corner frequency of the filter. From these relationships, it follows that speeding up the clock frequency ($f_{CLK}$) of the sigma-delta modulator results in a corresponding reduction in the amount of ripple. The improvement in ripple performance can then be traded for faster response time, by increasing the bandwidth of the analog filter.

Although the invention is described in conjunction with a first order sigma-delta modulator, higher order sigma-delta modulators (i.e., second or third order modulator) can also be used. Generally, higher order sigma-delta modulators push more in-band quantization noise to higher frequencies where filtering may be more easily performed. If the order of the sigma-delta modulator is higher than the order of the analog filter, the out-of-band quantization noise may not be adequately filtered and the analog signal may contain high amounts of out-of-band noise that may degrade the performance of the system. The order of the sigma-delta modulator is selected in light of the order of the analog filter used.

The time response adjustment circuit of the invention can provide improved performance when used in conjunction with a sigma-delta modulator. However, the time response adjustment circuit can also be used in combination with a PWM, a PDM, or an M-bit DAC.

Analog Filter

A single order lowpass filter is typically used to filter the modulator signal from the modulator. The single order filter can be implemented with a single resistor and a single capacitor. Although the single order filter results in a low component count, the response time and ripple performance is not satisfactory for some applications.

In conjunction with the invention, a second order or higher order filter can be used to provide faster response time or smaller amount of ripple, or both, on the analog signal. The improvement in performance with a second order lowpass filter over a single order lowpass filter is described below. In a specific embodiment, the second order filter is implemented as a RC-RC filter having two resistors and two capacitors, as shown in FIG. 3A. This implementation is only slightly more complex than the single order RC filter but provides much improved performance when used in combination with the time response adjustment circuit of the invention.

With a first order RC filter, over much of the range of operation (i.e., for frequencies higher than the frequency of the pole of the filter, $$f_P = \frac{1}{RC}),$$

ripple is proportional to the cutoff frequency $f_P$ of the RC filter. This results from the fact that the magnitude of the frequency response of the RC filter falls off as 1/f beyond the pole frequency. The ripple on the analog signal has a lowest fundamental frequency equal to the periodicity of the waveform, or $$f_{ripple} = \frac{f_{CLK}}{2^N},$$

where $f_{CLK}$ is the frequency of the clock signal used to clock the modulator.

The general transfer function of a second order lowpass filter can be expressed as:

$$H(s) = \frac{\omega_n^2}{s^2 + 2\zeta\omega_n s + \omega_n^2}, \quad \text{Eq (8)}$$

where the poles are given by:

$$p_{1,2} = -\zeta\omega_n \pm \omega_n\sqrt{\zeta^2 - 1}. \quad \text{Eq (9)}$$

For a second order RC-RC lowpass filter shown in FIG. 3A, $\zeta$>1, both poles $p_1$ and $p_2$ are real, and the transfer function reduces to:

$$H(s) = \frac{p_1 p_2}{(s - p_1)(s - p_2)}. \quad \text{Eq (10)}$$

For a second order filter having two poles, the frequency response of the filter falls off as 1/f between the frequencies of the first and second poles, and as $1/f^2$ after the frequency of the second pole. By selecting the frequencies of the two poles to be lower than the ripple components (i.e., $f_{p1}$ and $f_{p2}$<$f_{ripple}$), the ripple is attenuated by 40 dB/decade slope, which is faster than a slope of 20 dB/decade achieved with a first order filter. The improvement in ripple can then be traded for improvement in the response time of the filter. Stated differently, to meet a particular ripple requirement, the poles of the second order filter can be increased higher than that of the single order filter, thereby resulting in a faster response time without sacrificing ripple performance.

Referring to equation (8), the natural frequency $\omega_n$ controls the time scale of the second order filter. The desire for smaller ripple amplitude and faster response time poses conflicting requirements on this parameter. For a second order filter, a critically damped condition results in the fastest step response without overshoot. For a second order filter, the critically damped condition occurs for $\zeta=1$ which results in the poles being located at the same position on the real axis (or $p_1=p_2$).

In an application that requires fast response time for a specified ripple amplitude, the RC-RC filter can be designed to approach the critically damped condition (i.e., $\zeta$ as close to 1 as possible), and the natural frequency $\omega_n$ is increased as high as allowed by the specified ripple performance. Analysis indicates that by using a second order critically damped filter, the response time of the filter can be sped up by a factor of approximately ten over that of a single order filter for a ripple amplitude specification of 30% of an LSB. The response time improvement is even greater for smaller specified ripple amplitude.

Further improvements in the response time may be achieved through the use of even higher order filters (e.g., third order, fourth order, or higher order).

FIG. 3A shows a filter implementation comprising only resistors and capacitors. Filters using other reactive components (e.g., inductors) can also be designed. For example, a second order filter can be designed using a single inductor and a single capacitor. LC filters provide additional flexibility since the damping $\zeta$ for these filters can take on all values, unlike RC filters that are limited to $\zeta>1$. Thus, an LC filter can be designed to be under-dampened (i.e., having $\zeta<1$) to provide even faster response time with some overshoot. The filter can also be implemented as an active filter in the manner known in the art. The various filter implementations are within the scope of the invention.

Specific Implementation of an Interface Circuit

Figure 7:
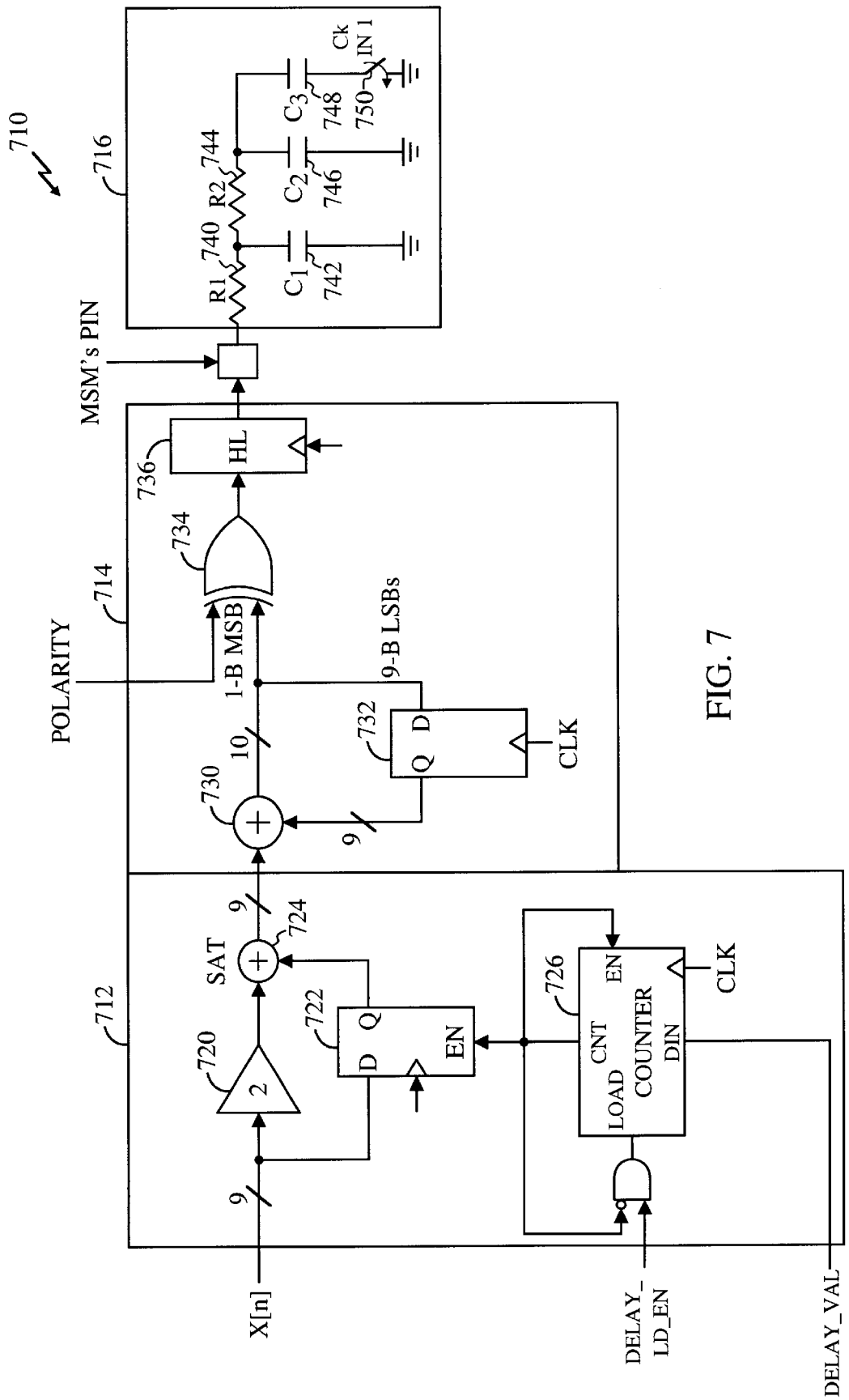
FIG. 7 shows a diagram of a specific embodiment of an interface circuit of the invention.

FIG. 7 shows a diagram of a specific embodiment of an interface circuit 710 of the invention that is used, for example, for the transmitter AGC loop for a CDMA cellular phone. Interface circuit 710 includes a time response adjustment circuit 712, a first order sigma-delta modulator 714, and a second order lowpass filter 716.

Within time response adjustment circuit 712, the digital signal x[n] is provided to a gain element 720 and a register 722. Gain element 720 scales the digital signal by a scaling factor of two to generate 2x[n]. Register 722 latches the digital signal x[n] after a period of delay as determined by the delay value on the bus (Delay_Val). Register 722 retains the old value until the new value is latched. A counter 726 is loaded with the delay value and provides an enable signal for register 722 after the delay period indicated by the delay value. The scaled signal from gain element 720 and the delayed signal from delay element 722 are provided to a summer 724 that subtracts the delayed signal from the scaled signal. Summer 724 is a saturation summer that generates an adjusted signal y[n] having N bit values that fall within the input range of sigma-delta modulator 714. The adjusted signal is provided to sigma-delta modulator 714.

Sigma-delta modulator 714 is similar in implementation to the modulator shown in FIG. 6, with N=9. Lowpass filter 716 filters the modulator signal from modulator 714 to generate the analog signal. In the embodiment shown in FIG. 7, lowpass filter 716 is a second order RC—RC filter, similar to that shown in FIG. 3A.

Many cellular phones operate in more than one operating mode. For example, dual-band cellular phones are capable of operation in either digital mode or analog mode. The digital mode can be characterized by the transmission of a code division multiple access (CDMA) signal or a time division multiple access (TDMA) signal such as a Global System for Mobil Communication (GSM) signal. The analog mode can be characterized by the transmission of a frequency modulated (FM) signal or an amplitude modulated (AM) signal.

Often, the requirements for the digital mode and the analog mode are different. For example, fast response time is required in digital (e.g., CDMA) mode and lower ripple amplitude is required for analog (e.g., FM) mode. Consequently, the bandwidth of the analog filter is wider for digital mode in order to achieve faster response time and more narrow for analog mode in order to obtain lower ripple amplitude. Cellular phones that operate in both modes are required to meet the specifications of both modes, and the combined requirements can complicate the design of dual-mode phones.

As shown in FIG. 7, filter 716 includes an additional capacitor 748 coupled in series with a switch 750, the combination of which is coupled in parallel with a capacitor 746. In digital mode when wider bandwidth is required for faster response time, switch 750 is opened and capacitor 748 is not part of the RC—RC filter. In analog mode when a narrower bandwidth is required for smaller ripple amplitude, switch 750 is closed and capacitor 748 is coupled in parallel with capacitor 746 to provide more capacitance. In a specific embodiment, the following values are selected for the resistors and capacitors: R1=R2=1 K$\Omega$, C1=10 nF, C2=5 nF (for CDMA mode), and C3=120 nF (for FM mode). With this implementation, the same basic RC-RC filter (R1=R2=1 K$\Omega$, C1=10 nF, C2=5 nF) is used for both modes and the additional capacitor 748 (C3=120 nF) is switched in parallel with capacitor 746 for the analog mode. Switch 750 can be implemented with a bipolar transistor, a metal-oxide-semiconductor (MOS) gate, or other circuit elements.

Different time response characteristics can also be achieved, in part, by selecting the appropriate frequency for the modulator clock ($f_{CLK}$). In a specific implementation, $f_{CLK}$=19.6608 MHz for CDMA mode and $f_{CLK}$=19.68 MHz for FM mode, for a 9-bit modulator implementation. For an AGC control loop, the lowest fundamental frequency ($f_{CLK}/512$) is typically 38.4 KHz for both CDMA and FM modes. The poles of second order RC filters are selected such that these RC-RC filters provide adequate ripple attenuation to meet the ripple specifications. For FM mode, the ripple specifications are typically more difficult to meet, and the FM RC-RC filter is designed to provide more attenuation. Thus, the poles of the FM RC-RC filter are set at lower frequencies (e.g., $p_1$=624 Hz and $p_2$=32.48 kHz) so that the ripple fundamentals are at frequencies higher than $p_1$ and $p_2$, and are attenuated at 40 dB/decade. For CDMA mode, the constraints on ripple filtering are more relaxed, allowing $p_1$ and $p_2$ to be set at higher frequencies (e.g., $p_1$=9.33 kHz and $p_2$=54.34 kHz). The lowest fundamental located between $p_1$ and $p_2$ is attenuated at 20 dB/decade and the remaining ripple fundamentals at frequencies greater than $p_1$ and $p_2$ are attenuated at 40 dB/decade.

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. For example, the invention can also be used to provide shaped step response and other characteristics. Thus, the present invention is not intended to be limited to the embodiments shown herein but is to be accorded the widest scope consistent with the principles and novel features disclosed herein.

What is claimed is:

1. An interface circuit comprising:

a time response adjustment circuit that receives a digital signal and generates an adjusted signal;

a modulator coupled to the time response adjustment circuit to receive the adjusted signal and generate a modulator signal; and a filter coupled to the modulator to receive the modulator signal and generate an analog signal, wherein the analog signal has a time response that is modified by the time response adjustment circuit.

2. The circuit of claim 1 wherein the time response adjustment circuit generates an overdrive pulse corresponding to a change in the digital signal.

3. The circuit of claim 2 wherein the overdrive pulse has an amplitude twice that of the change in the digital signal.

4. The circuit of claim 2 wherein the overdrive pulse has an amplitude determined by a magnitude of the change in the digital signal.

5. The circuit of claim 2 wherein the overdrive pulse has a time duration determined by a magnitude of the change in the digital signal.

6. The circuit of claim 2 wherein the overdrive pulse is clipped to within a input range of the modulator.

7. The circuit of claim 6 wherein a time duration of the clipped overdrive pulse is lengthened in accordance with an amount of clipping.

8. A circuit of claim 1 wherein the modulator is a sigma-delta modulator.

9. A circuit of claim 8 wherein the sigma-delta modulator is first order.

10. A circuit of claim 1 wherein the filter is a second order RC lowpass filter.

11. A control loop comprising the interface circuit of claim 1.

12. A receiver comprising the interface circuit of claim 1.

13. An interface circuit comprising:

a time response adjustment circuit that receives a digital signal and generates an adjusted signal, time response adjustment circuit including a gain element that receives and scales the digital signal by a scaling factor, a delay element that receives and delays the digital signal by a time delay, and a summer coupled to the gain element and the delay element;

a modulator coupled to the time response adjustment circuit to receive the adjusted signal and generate a modulator signal; and a filter coupled to the modulator to receive the modulator signal and generate an analog signal, wherein the analog signal has a time response that is modified by the time response adjustment circuit.

14. The circuit of claim 13 wherein the scaling factor is two.

15. The circuit of claim 13 wherein the time delay is determined by a value on a control signal.

16. The circuit of claim 13 wherein the time delay is determined, in part, based on a magnitude of a change in the digital signal.

17. The circuit of claim 13 wherein the scaling factor and the time delay are programmable.

18. A circuit of claim 13 further comprising:

an exclusive-OR gate that receives the modulator signal and a polarity signal and generates a modulator signal having a correct polarity, wherein the filter receives the modulator signal having the correct polarity.

19. An method for modifying a time response of an analog signal comprising:

receiving a digital signal;

generating an adjusted signal based on the digital signal and changes in the digital signal;

generating a modulator signal based on the adjusted signal;

filtering the modulator signal to obtain an analog signal, wherein the analog signal has a time response that is modified.

20. The method of claim 13 wherein the time response of the analog signal is modified by adjustment of a frequency of a clock signal used to clock the modulator.

21. The method of claim 13 wherein the time response of the analog signal is modified by adjustment of a bandwidth of the filter.

22. The method of claim 19 wherein the time response of the analog signal is modified based on changes in magnitude of the digital signal.

23. The method of claim 22 wherein the time response of the analog signal is further modified based on time delay and scaling factor of the time response adjustment circuit.

24. The method of claim 19 wherein the adjusted signal includes overdrive pulses corresponding to changes in the digital signal.

25. A receiver comprising:

a variable gain element;

a gain control loop that sets a gain of the variable gain element, the gain control loop including a loop control circuit that generates a digital control signal, a time response adjustment circuit coupled to the loop control signal to receive the digital control signal and generate an adjusted signal, a modulator coupled to the time response adjustment circuit to receive the adjusted signal and generate a modulator signal, a filter coupled to the modulator to receive the modulator signal and generate an analog control signal, wherein the gain of the variable gain element is adjusted in accordance with the analog control signal.

* * * * *